United States Patent
Ito

(10) Patent No.: US 7,429,773 B2
(45) Date of Patent: Sep. 30, 2008

(54) SEMICONDUCTOR APPARATUS AND MIS LOGIC CIRCUIT

(75) Inventor: Minoru Ito, Shiga-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 135 days.

(21) Appl. No.: 11/353,075

(22) Filed: Feb. 14, 2006

(65) Prior Publication Data

US 2006/0186472 A1     Aug. 24, 2006

(30) Foreign Application Priority Data

Feb. 24, 2005   (JP)   ............... 2005-048877
Aug. 24, 2005   (JP)   ............... 2005-243310

(51) Int. Cl.
H01L 27/12   (2006.01)
H01L 27/108  (2006.01)
H01L 29/94   (2006.01)

(52) U.S. Cl. .................. 257/350; 257/347; 257/348; 257/296

(58) Field of Classification Search .............. 257/347, 257/532, 374, 350, 296, 348
See application file for complete search history.

(56) References Cited

U.S. PATENT DOCUMENTS 6,063,686 A *  5/2000  Masuda et al. ............. 438/406
6,213,869 B1    4/2001  Yu et al.
6,670,679 B2 * 12/2003  Hirata ....................... 257/360

FOREIGN PATENT DOCUMENTS

JP    7-211079     8/1995
JP   10-242839     9/1998
JP   11-307652    11/1999

OTHER PUBLICATIONS

English Language Abstract of JP7-211079.
English Language Abstract of JP 11-307652.
English Language Abstract of JP 10-242839.

* cited by examiner

*Primary Examiner*—Richard T. Elms
*Assistant Examiner*—Allison P Bernstein
(74) *Attorney, Agent, or Firm*—Greenblum & Bernstein, P.L.C.

(57) ABSTRACT

A configuration is adopted including an NchMOS transistor (1) equipped with an insulating isolation layer (4) providing insulation and isolation using an SOI structure, and a capacitor formed using an insulating film, with a silicon substrate (B) being made thin and substrate capacitance being reduced. The NchMOS transistor (1) is equipped with insulating isolation regions (5a, 5b) that are perfectly depleted or partially depleted in a manner close to being perfectly depleted. An electrode (6) connected to a gate electrode (G) of the NchMOS transistor (1) and an impurity diffusion layer (7) are connected via a capacitor (2). A source electrode (S) is connected to a power supply terminal (3 *a*), a gate electrode (G) is connected to an internal signal line (S 1), and a drain electrode (D) is connected to an internal signal line (S2). Substrate bias voltage is then controlled using capacitor coupling when the NchMOS transistor (1) is turned on/off.

2 Claims, 8 Drawing Sheets

SEMICONDUCTOR APPARATUS AND MIS LOGIC CIRCUIT

BACKGROUND OF THE INVENTION

1. Field of the Invention

The present invention relates to an MIS (Metal Insulator Semiconductor) structure semiconductor apparatus made on Silicon On Insulator (SOI). More particularly, the present invention relates to a semiconductor apparatus such as an MOS (Metal Oxide Semiconductor) achieving both high-speed operation and low leakage current, and complimentary MIS logic circuit made using this semiconductor apparatus.

2. Description of Related Art

In the related art, it is well-known that, in order to make MOS transistors themselves high-speed, in addition to miniaturizing the semiconductor elements and making gate lengths of MOS transistors shorter, lowering threshold voltage is extremely effective. However, there is a tendency for sub-threshold leakage current that is unnecessary current flowing between a source and a drain to increase as the threshold voltage is lowered. Various technology has therefore been reported to implement countermeasures so that sub-threshold leakage current does not increase.

For example, static RAM that suppresses sub-threshold leakage current by applying a back-bias voltage to a silicon substrate only at the time of standby so as to increase the threshold voltage of a MOS transistor is known, as in patent document 1 (Japanese Patent Laid-open Publication No. Hei. 7-211079). According to this technology, a ground voltage VSS=0V is supplied as a back-bias voltage for a driver transistor at the time of an access. When a threshold voltage of a driver transistor is then, for example, 0.4V, at the time of a standby state, a negative voltage VAA=-2V is supplied as a back-bias voltage for the driver transistor, and a threshold voltage for the driver transistor is made, for example, 0.9V. As a result, it is possible to raise the threshold voltage from 0.4V to 0.9V and increases in the sub-threshold leakage current can be suppressed.

Further, in Japanese patent document 2 (Japanese Patent Laid-open Publication No.Hei.11-307652), circuits inviting a substrate bias effect by utilizing capacitor coupling using a buffer output signal of the same phase as a gate signal are known for pass transistor logic employing NMOS transistors. According to this technology, in the event that a pair of output signals from logic circuits configured with pass transistor logic employing NMOS transistors are buffered using CMOS inverters, an output terminal of one of the CMOS inverters and a channel region of a transistor constituting the other CMOS inverter are respectively capacitor-coupled via a silicon substrate. An output signal of a CMOS inverter for which a rising level transition is fast from the time where an input signal changes is then applied to a silicon substrate of a transistor on the side of the other CMOS inverter. The drive power of the transistor is then increased by this substrate bias effect and a rising level transition for an output signal of the other CMOS inverter is made faster.

Further, in another embodiment of Japanese patent document 2, in the event that an output signal from a logic circuit configured with pass transistor logic employing NMOS transistors is buffered using a CMOS inverter, an inverted signal is made from the output signal of this inverter via a separate CMOS inverter. This signal and the channel region of the transistor constituting the first CMOS inverter are capacitor-coupled via a silicon substrate. As a result, it is possible to cause a substrate bias effect.

Further, in patent document 3 (U.S. Pat. No. 6,213,869), technology is disclosed where substrate potential shifts to a forward bias side when a MOS transistor goes on as a result of utilizing gate capacitance between a gate of a MOS transistor formed on a floating substrate and the substrate so as to stabilize the voltage at which a BJT (Bipolar Junction Transistor) formed in parallel with the MOS transistor goes on. This means that the threshold voltage of the MOS transistor becomes small and the drive power becomes high. Conversely, when the MOS transistor goes OFF, the substrate potential shifts to the back-bias side. Lower power consumption increased can then be achieved due to the threshold voltage of the MOS transistor being large.

However, the method of suppressing the sub-threshold leakage current disclosed in patent document 1 requires a circuit for applying the substrate bias and this causes the semiconductor apparatus to become large and costs to increase. Further, with the technology disclosed in patent document 2, a pair of signals of normal and reverse phases such as with pass transistor logic are necessary, which means that signal circuits become complex. Moreover, with the technology of another embodiment of patent document 2, a CMOS inverter is necessary every one output. This means that if the number of outputs is large, the circuit scale also becomes large.

Further, in Japanese patent document 3, as a result of transistor sizes becoming more and more miniaturized, gate surface areas are reducing and gate capacitances of MOS transistors on floating substrates are getting smaller. Moreover, voltages applied to gates are also becoming lower in accompaniment with power supply voltages becoming lower. As a result, when a gate voltage is applied in order to put a MOS transistor ON, cases where a change in substrate potential resulting from the gate capacitance no longer exceeding a clamp voltage $V_C$ of a diode constructed from the base and emitter of the BJT occur, and the substrate potential therefore becomes unstable.

SUMMARY OF THE INVENTION

It is therefore an object of the present invention to provide a semiconductor apparatus and complimentary MIS logic circuit configured using this semiconductor apparatus that control the substrate bias voltage using a simple method without a substrate bias application circuit and enable the simultaneous implementation of both high-speed operation and lower power consumption during standby without making substrate potential unstable when a MOS transistor goes on.

According to an aspect of the present invention, a semiconductor apparatus forming an insulating isolation region on a silicon substrate of an SOI (Silicon On Insulator) structure has: a perfectly depleted or close to being perfectly depleted partially depleted-type MIS transistor formed on an electrically insulated silicon substrate surrounded by the insulating isolation region; and a capacitor formed using an insulating film, and, in this semiconductor apparatus, an electrode connected to a gate electrode of the MIS transistor and an impurity diffusion layer formed within the silicon substrate and diffused with the same impurities as the silicon substrate are connected via the capacitor; and a BJT (Bipolar Junction Transistor) where a drain of the MIS transistor corresponds to a collector, the silicon substrate corresponds to a base, and a source corresponds to an emitter is formed, and where, when gate voltage with respect to the source is $V_{GS}$, gate capacitance of the MIS transistor is $C_G$, capacitance of the capacitor is $C_C$, parasitic capacitance is $C_P$, clamp voltage of the BJT is $V_C$, and silicon substrate potential immediately prior to change in gate potential is $V_{B(I)}$, then $V_{B(I)}+(C_G+C_C)*V_{GS}/(C_G+C_C+C_P)>V_C$.

According to another aspect of the present invention, a semiconductor apparatus forming an insulating isolation region on a silicon substrate of an SOI structure has: a perfectly depleted or close to being perfectly depleted partially depleted-type N-channel MIS transistor, formed on an electrically insulated silicon substrate surrounded by the insulating isolation region; and an N-channel MIS transistor for substrate potential control use, provided between a source electrode of the N-channel MIS transistor and the silicon substrate, and, in this semiconductor apparatus, a gate electrode of the N-channel MIS transistor and a gate electrode of the N-channel MIS transistor for substrate potential control use are connected; and silicon substrate potential becomes the same as the source potential when the N-channel MIS transistor goes on.

According to another aspect of the present invention, a semiconductor apparatus forming an insulating isolation region on a silicon substrate of an SOI structure has: a perfectly depleted or close to being perfectly depleted partially depleted-type P-channel MIS transistor, formed on an electrically insulated silicon substrate surrounded by the insulating isolation region; and a P-channel MIS transistor for substrate potential control use, provided between a source electrode of the P-channel MIS transistor and the silicon substrate, and, in this semiconductor apparatus, a gate electrode of the P-channel MIS transistor and a gate electrode of the P-channel MIS transistor for substrate potential control use are connected; and silicon substrate potential becomes the same as the source potential when the P-channel MIS transistor goes on.

According to yet another aspect of the present invention, a semiconductor apparatus forming an insulating isolation region on an SOI structure silicon substrate has: one or a plurality of perfectly depleted or close to being perfectly depleted partially depleted-type N-channel MIS transistors formed on an electrically insulated silicon substrate surrounded by the insulating isolation region; a capacitor formed using an insulating film; and an N-channel MIS transistor for substrate potential control use, and, in this semiconductor apparatus, the N-channel MIS transistor for substrate potential control use is connected between source electrodes of the one or a plurality of N-channel MIS transistors and the silicon substrate; an electrode connected to a gate electrode of the N-channel MIS transistor for substrate potential control use and an impurity diffusion layer formed within the silicon substrate and diffused with the same impurities as the silicon substrate are connected via the capacitor; and the capacitor and the gate electrode of the N-channel MIS transistor for substrate potential control use are isolated from the one or plurality of N-channel MIS transistor gate electrodes.

According to yet another aspect of the present invention, a semiconductor apparatus forming an insulating isolation region on a silicon substrate of an SOI structure has: one or a plurality of perfectly depleted or close to being perfectly depleted partially depleted-type P-channel MIS transistors formed on an electrically insulated silicon substrate surrounded by the insulating isolation region; a capacitor formed using an insulating film; and a P-channel MIS transistor for substrate potential control use, and, in this semiconductor apparatus, the P-channel MIS transistor for substrate potential control use is connected between source electrodes of the one or a plurality of P-channel MIS transistors and the silicon substrate; an electrode connected to a gate electrode of the P-channel MIS transistor for substrate potential control use and an impurity diffusion layer formed within the silicon substrate and diffused with the same impurities as the silicon substrate are connected via the capacitor; and the capacitor and the gate electrode of the P-channel MIS transistor for substrate potential control use are isolated from the one or plurality of P-channel MIS transistor gate electrodes.

BRIEF DESCRIPTION OF THE DRAWINGS

The above and other objects and features of the invention will appear more fully hereinafter from a consideration of the following description taken in connection with the accompanying drawings, in which.

DETAILED DESCRIPTION OF THE PREFERRED EMBODIMENTS

The following is a detailed description with reference to the drawings of preferred embodiments of the present invention.

First Embodiment

Figure 1:
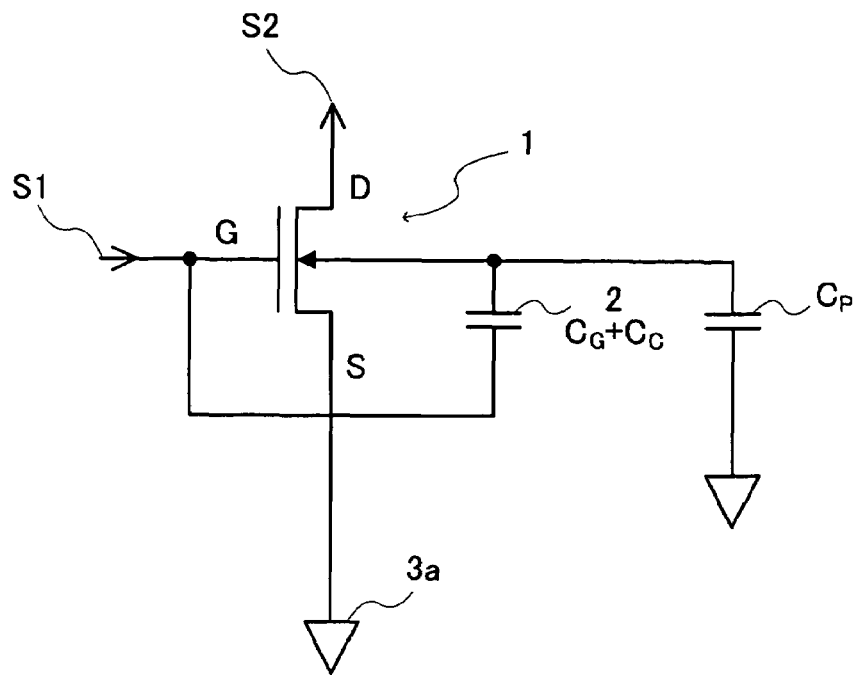
FIG. 1 is a circuit diagram showing a configuration for an NchMOS-type semiconductor apparatus of a first embodiment of the present invention.
Figure 2:
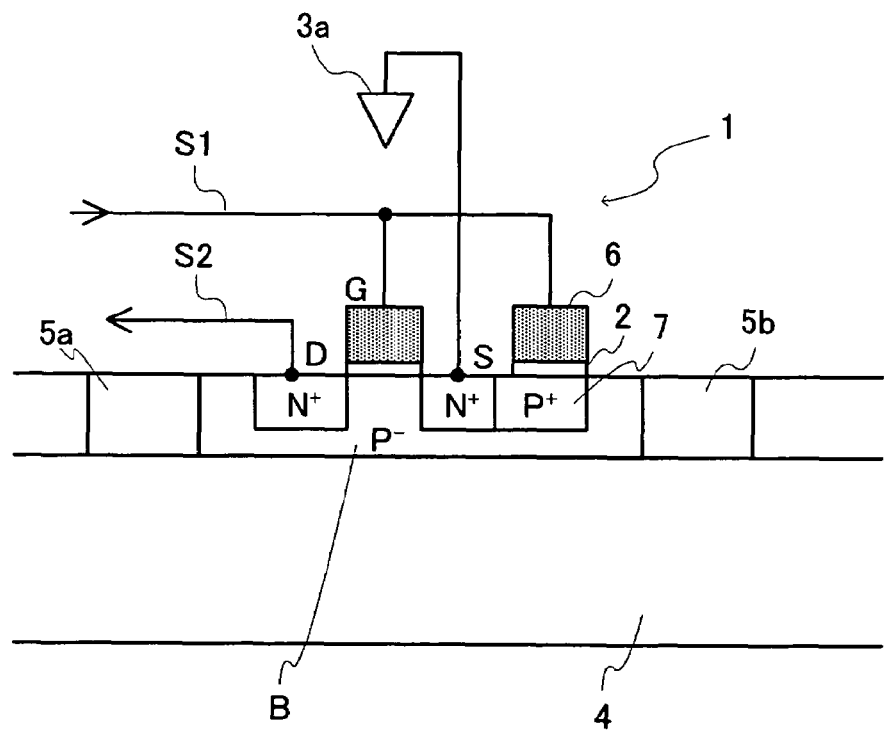
FIG. 2 is a schematic cross-sectional view of the NchMOS-type semiconductor apparatus shown in FIG. 1.
Figure 3:
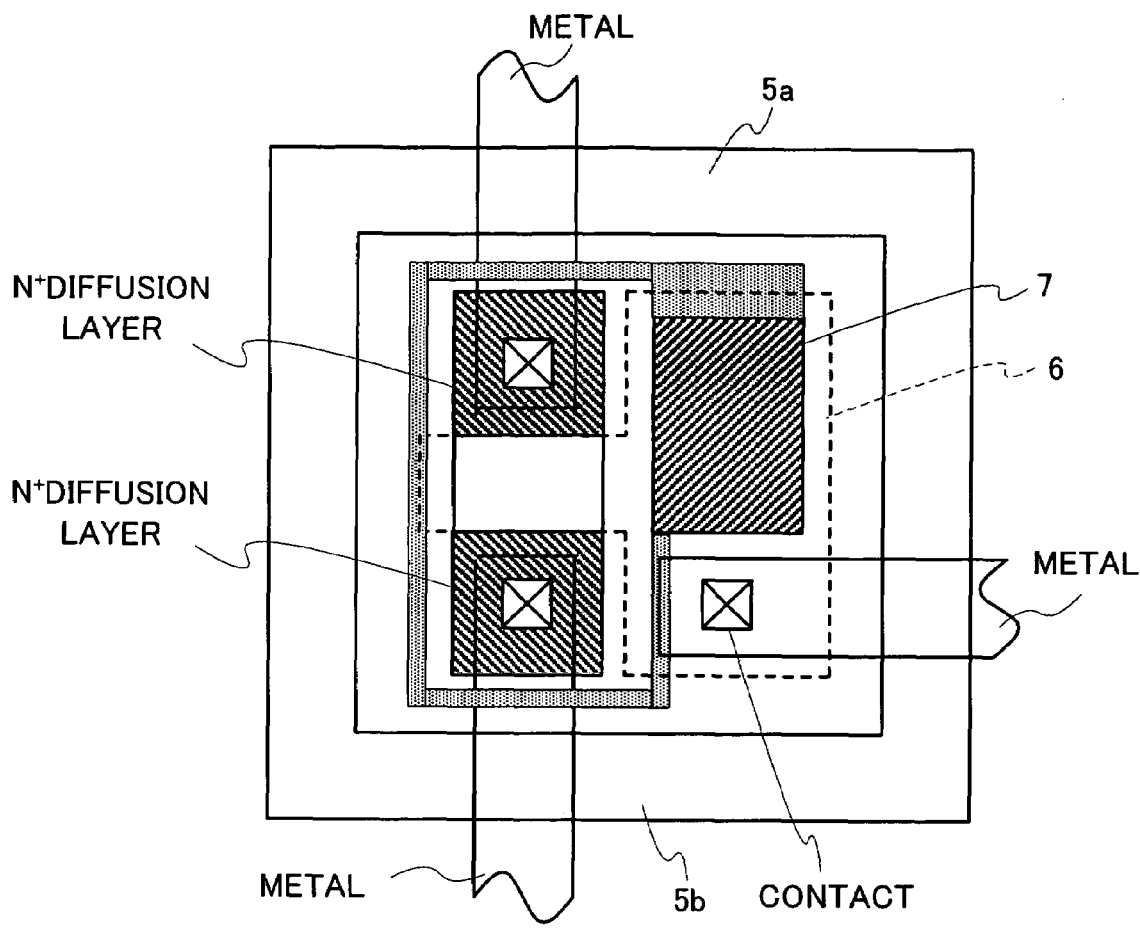
FIG. 3 is a plan view showing an example of a mask drawing for the NchMOS-type semiconductor apparatus shown in FIG. 1.

FIG. 1 is a circuit diagram showing a configuration for an NchMOS-type semiconductor apparatus of a first embodiment of the present invention. Further, FIG. 2 is a schematic cross-sectional view of the NchMOS-type semiconductor apparatus shown in FIG. 1. Moreover, FIG. 3 is a plain view showing an example of a mask drawing for the NchMOS-type semiconductor apparatus shown in FIG. 1. First, a description is given of a circuit configuration for an NchMOS-type semiconductor apparatus corresponding to the first embodiment using FIG. 1 and FIG. 2.

The NchMOS-type semiconductor apparatus shown in FIG. 1 and FIG. 2 is comprised of a perfectly depleted or close to perfectly depleted partially depleted-type NchMOS transistor 1 formed on a silicon substrate in an electrically insulated and isolated floating state by providing insulating isolation regions 5a, 5b on a silicon substrate equipped with an insulating isolation layer 4 insulated and isolated by an SOI structure, and a capacitor 2 formed using an insulating film, with a silicon substrate B being formed thin so as to reduce substrate capacitance. In this configuration, a BJT is formed, where the drain of the NchMOS transistor 1 naturally corresponds to the collector, the silicon substrate corresponds to the base, and the source corresponds to the emitter. An electrode (for example, polysilicon) 6 connected to a gate electrode G of the NchMOS transistor 1 and an impurity diffusion layer (for example, P⁺ diffusion layer) 7 diffused with the same impurities (P) as the silicon substrate (P⁻) B are connected via a capacitor 2 formed using an insulating layer. Further, a source electrode S of the NchMOS transistor 1 is connected to a power supply terminal 3a, gate electrode G is connected to an internal signal line S1, and drain electrode D is connected to internal signal line S2.

Further, as can be understood from the mask drawing for the NchMOS-type semiconductor apparatus of the first embodiment shown in FIG. 3, it is possible to configured the capacitor shown in FIG. 1 by effectively utilizing portions that are of no use to the NchMOS transistor 1. This means that increases in chip surface area are comparatively small. For example, in FIG. 3, the capacitor 2 can be formed by forming an oxidation film between the polysilicon (electrode) 6 and the P⁺ diffusion layer (impurity diffusion layer) 7.

The impurity concentration of the P⁺ diffusion layer 7 is preferably ten times the impurity concentration of the silicon substrate (P⁻) or more. For example, the concentration of impurity diffusion at the source and drain of the PchMOS transistor may be utilized. A diffused resistance value may also be reduced in proportion to the impurity concentration. Further, substrate potential control use may be broadened to the whole of the silicon substrate by arranging the P⁺ diffusion layer 7 around the periphery of the NchMOS transistor 1.

Figure 13:
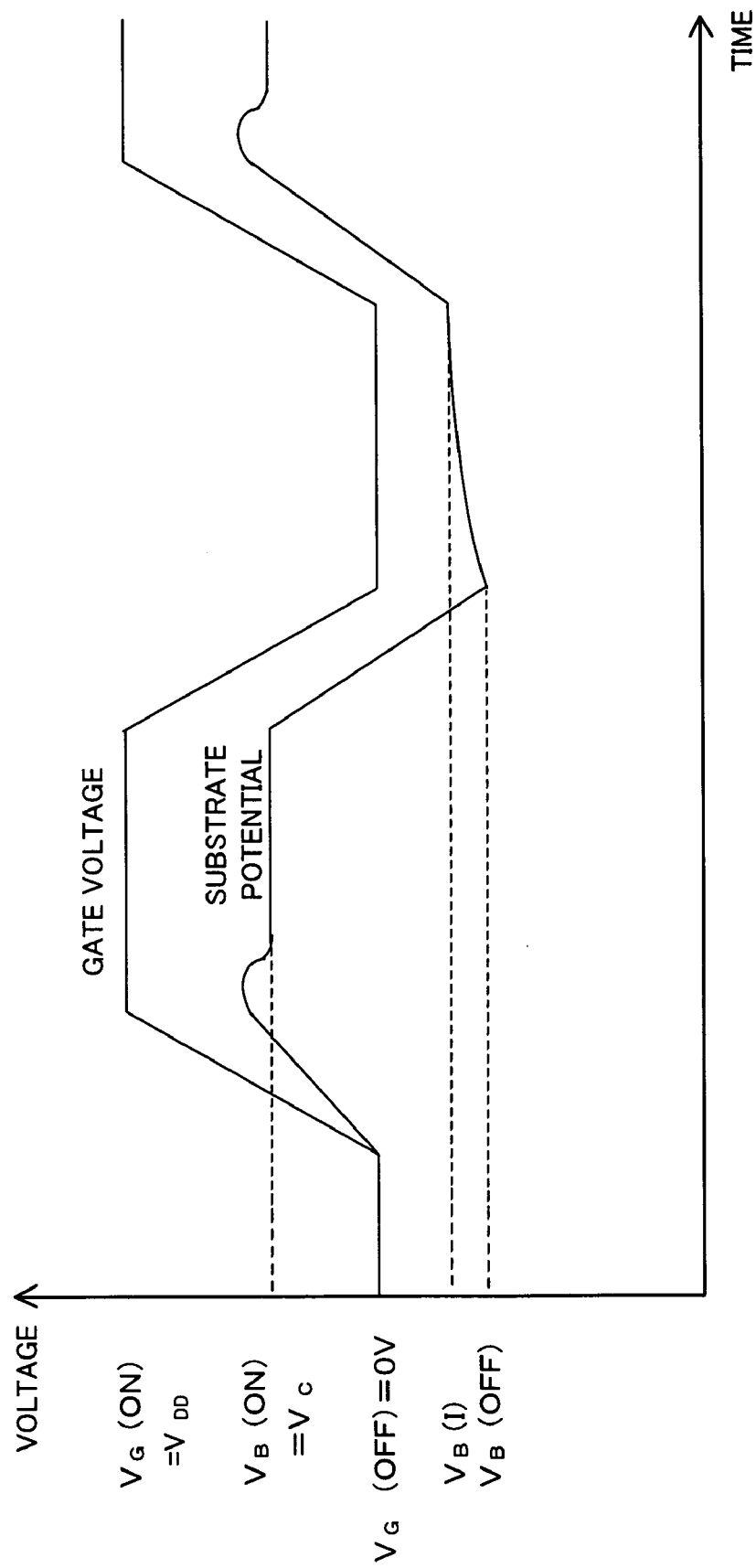
FIG. 13 is a view showing changes in gate voltage and substrate potential with respect to time for the first embodiment of the present invention.

Next, a description is given of the operation of the NchMOS-type semiconductor apparatus of the first embodiment of the present invention. FIG. 13 is a view showing changes in gate voltage and substrate potential with respect to time. In the case of the NchMOS transistor 1 shown in FIG. 1, when the voltage of the gate electrode G is changed from low to high, the NchMOS transistor 1 changes from an OFF state to an ON state, and the substrate potential is pushed up in the direction of a positive voltage by the coupling of the capacitor 2 so as to shift to a positive substrate potential. Assuming gate capacitance of the NchMOS transistor 1 is $C_G$, capacitance of the capacitor 2 is $C_C$, parasitic capacitance of the substrate is $C_P$, gate voltage is $V_{GS}$, clamp voltage of the BJT when the MOS transistor is ON is $V_C$, and substrate potential when the MOS transistor is ON is $V_{B(ON)}$, the substrate potential at this time can be expressed by the following equation (1).

$$V_{B(ON)} = V_{B(l)} + \frac{(C_G + C_C) \times V_{GS}}{(C_G + C_C + C_P)} \quad (1)$$

When the NchMOS transistor is on, when the substrate potential $V_{B(ON)}$ exceeds the clamp voltage $V_C$ of the diode configured with the base and emitter of the BJT, the substrate potential stabilizes at the clamp voltage $V_C$. It is therefore necessary for the substrate potential $V_{B(ON)}$ to exceed the clamp voltage $V_C$.

The threshold voltage therefore becomes low because the substrate potential is generated in a forward direction at the NchMOS transistor 1, and the drive power of the NchMOS transistor 1 increases.

Further, when the voltage of the gate electrode G changes from high to low, the NchMOS transistor 1 changes from an on state to an off state, and the substrate potential is pushed down in the direction of a negative voltage as a result of bootstrap effects due to the coupling of the capacitor 2, and shifts to a negative substrate potential. Assuming the substrate potential at the time when the MOS transistor goes off is $V_{B(OFF)}$, the substrate potential at this time can be expressed by the following equation (2).

$$V_{B(OFF)} = V_C - \frac{(C_G + C_C) \times V_{GS}}{(C_G + C_C + C_P)} \quad (2)$$

The substrate potential temporarily changes to $V_{B(OFF)}$, but, as time elapses, this potential gradually changes due to leakage current of a parasitic diode, and, if the time is short, such potential fluctuation can be ignored. Namely, because substrate potential is generated in a reverse direction at the NchMOS transistor 1 the threshold voltage becomes high and sub-threshold leakage current between the drain electrode D and the source electrode S decreases.

Describing the capacitor 2 shown in FIG. 1 using the configuration of FIG. 2, it is possible to configure the capacitor 2 shown in FIG. 1 by forming an oxidation film on diffusion layer 7 (P⁺) diffused with the same impurities as the silicon substrate B (P⁻) and then forming a conductor (electrode) such as polysilicon on top. Giving a description using FIG. 3, it is possible to form the capacitor 2 shown in FIG. 1 by forming an oxidation film on the P⁺ diffusion layer 7 constituting an impurity diffusion layer and forming a conductor (electrode) such as polysilicon 6 on top.

Figure 4:
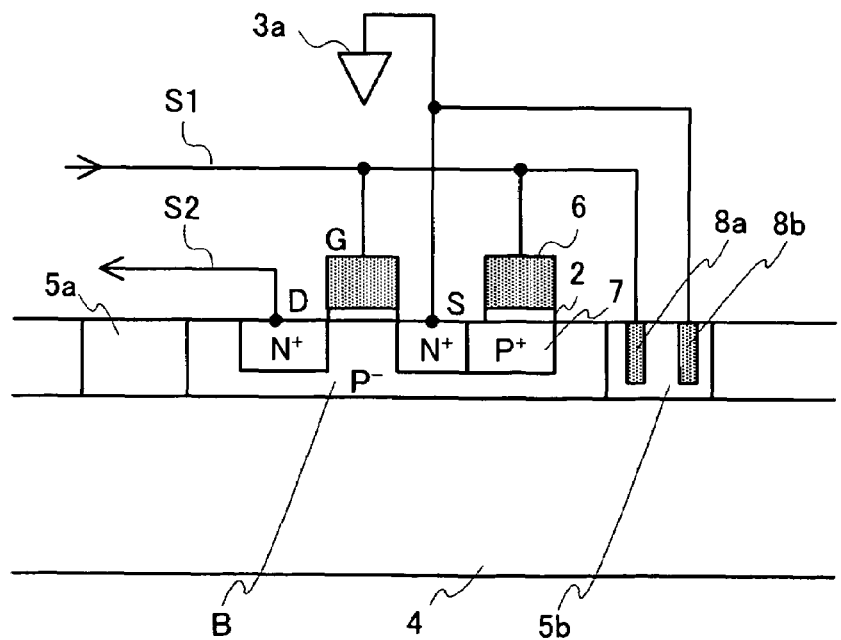
FIG. 4 is between-sectional view of a further form for the NchMOS-type semiconductor apparatus shown in FIG. 1.

FIG. 4 is between-sectional view of another form for the NchMOS-type semiconductor apparatus shown in FIG. 1. Namely, as shown in FIG. 4, the same impurity diffusion layer 7 as for the silicon substrate is formed at the silicon substrate section making contact with an insulating isolation region 5b, a trench is cut within this insulating isolation region 5b, and metal 8a, 8b is formed within this trench. By this means, it is possible to respectively form the capacitors 2 shown in FIG. 1 between the metal 8a within the trench and the silicon substrate B and the diffusion layer 7 of the same impurities as the silicon substrate B. In the case in FIG. 4, a structure is shown where the capacitor 2 utilizing the oxidation film shown in FIG. 2 and a capacitor formed respectively between the metal 8a within the trench and the silicon substrate B and the diffusion layer 7 of the same impurities as the silicon substrate B are used together. As a result, it is possible to further reduce chip surface area.

Second Embodiment

Figure 5:
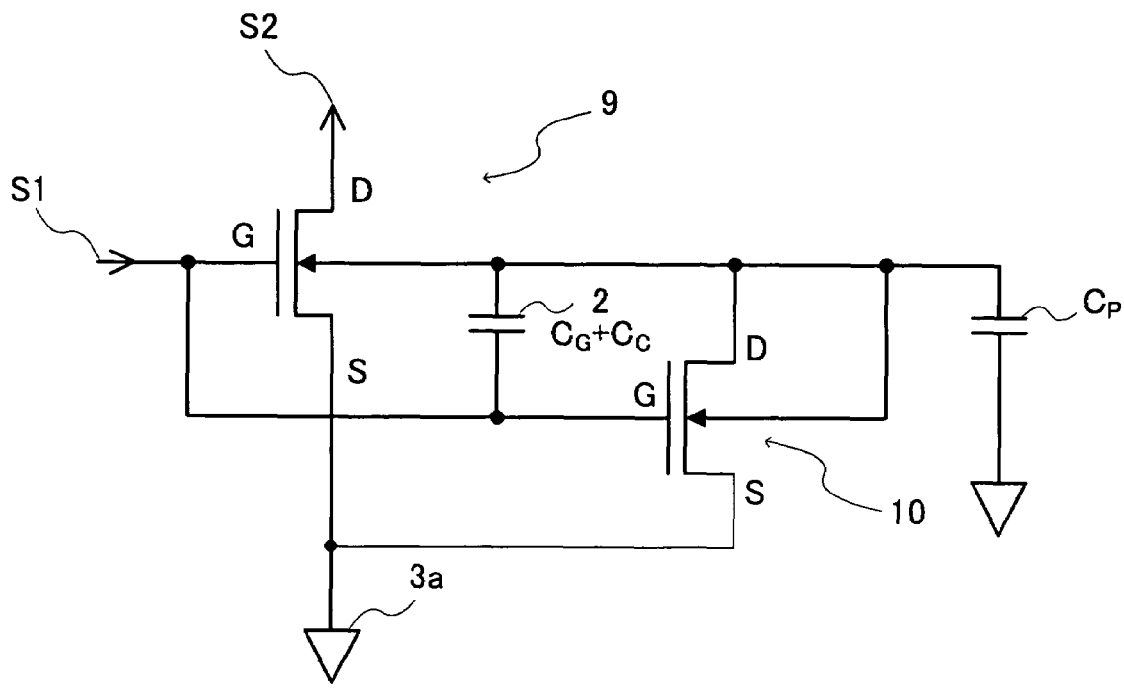
FIG. 5 is a circuit diagram showing a configuration for an NchMOS-type semiconductor apparatus of a second embodiment of the present invention.
Figure 6:
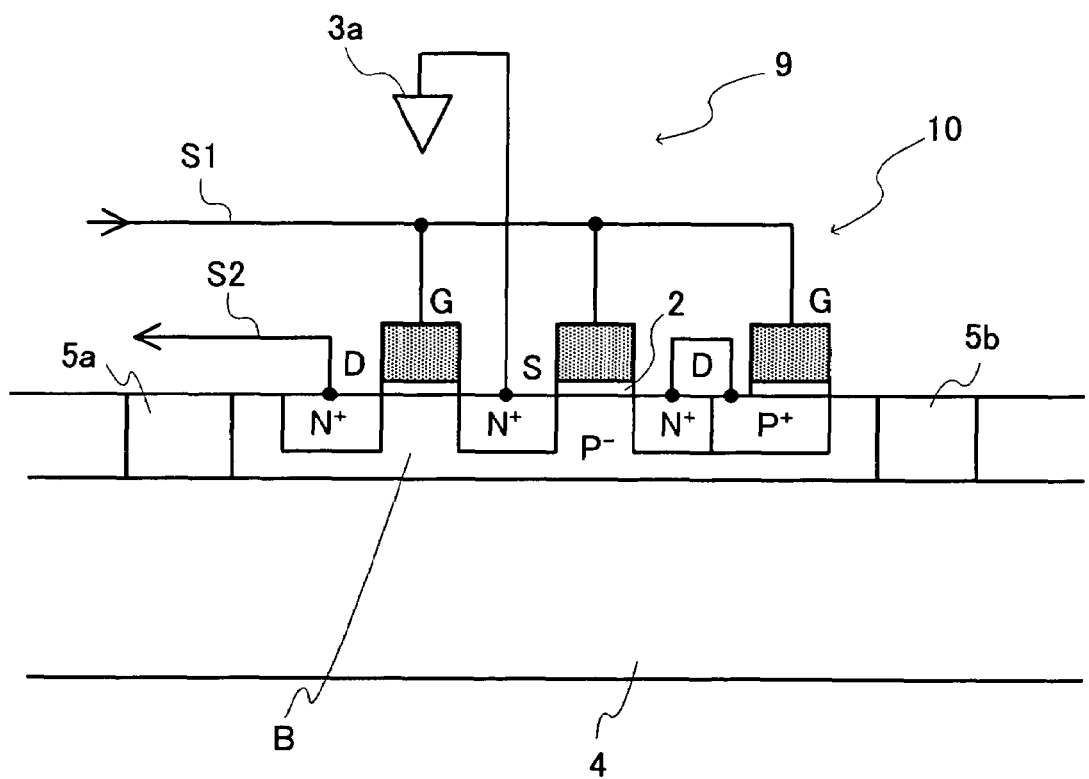
FIG. 6 is a schematic cross-sectional view of the NchMOS-type semiconductor apparatus shown in FIG. 5.

FIG. 5 is a circuit diagram showing a configuration for an NchMOS-type semiconductor apparatus of a second embodiment of the present invention. Further, FIG. 6 is a schematic cross-sectional view of the NchMOS-type semiconductor apparatus shown in FIG. 5. This NchMOS-type semiconductor apparatus has the same configuration as the NchMOS-type semiconductor shown in FIG. 1 and FIG. 2 and duplicate descriptions are therefore omitted. In the second embodiment shown in FIG. 5, a configuration is adopted where the NchMOS transistor 1 of the first embodiment shown in FIG. 1 is made a NchMOS transistor 9 for logic circuit use, and an NchMOS transistor 10 for substrate potential control use is added between a source electrode S and silicon substrate B of the NchMOS transistor 9 for logic circuit use, and the gate electrodes G of the NchMOS transistor 9 for logic circuit use and the NchMOS transistor 10 for substrate potential control use are connected together.

Figure 14:
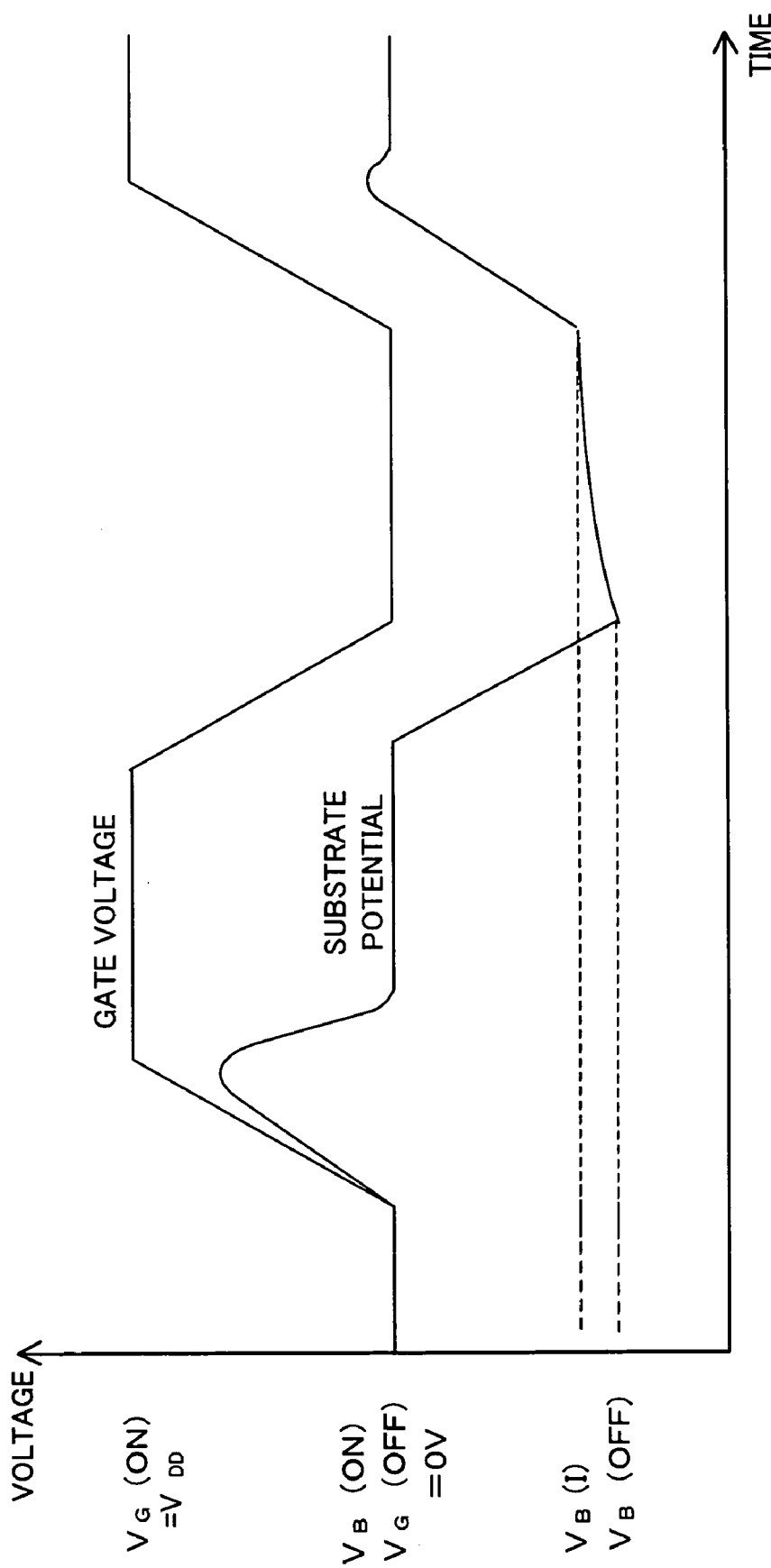
FIG. 14 is a view showing changes in gate voltage and substrate potential with respect to time for the second embodiment of the present invention.

FIG. 14 is a view showing change in gate voltage and substrate potential with respect to time. In this configuration, when the NchMOS transistor 9 for logic circuit use is in an ON state, the silicon substrate B and the source electrode S of the NchMOS transistor 9 for logic circuit use are at the same potential and a stable substrate potential is therefore obtained. When the NchMOS transistor 9 for logic circuit use changes from an ON state to an OFF state, substrate potential is pushed down in a negative voltage direction as a result of capacitor coupling as far as the threshold voltage of the NchMOS transistor 10 for substrate potential control use, but, as time elapses, the potential gradually changes due to parasitic diode leakage current. However, if the time is short, this potential fluctuation can be ignored. At this time, it is preferable to set the threshold voltage of the NchMOS transistor 9 for logic circuit use to be low (i.e. a negative voltage or a small positive voltage) and the threshold voltage of the NchMOS transistor 10 for substrate potential control use to be high (i.e. a large positive voltage). This is because the effect of pushing the silicon substrate B in a negative voltage direction is only effective up to the threshold voltage of the NchMOS transistor 10 for substrate potential control use. Namely, when the threshold voltage of the NchMOS transistor 10 for substrate potential control use is low, the substrate bias effect is small, and the difference in potential between the source electrode S of the NchMOS transistor 9 for logic circuit use and the silicon substrate B is small.

Third Embodiment

Figure 7:
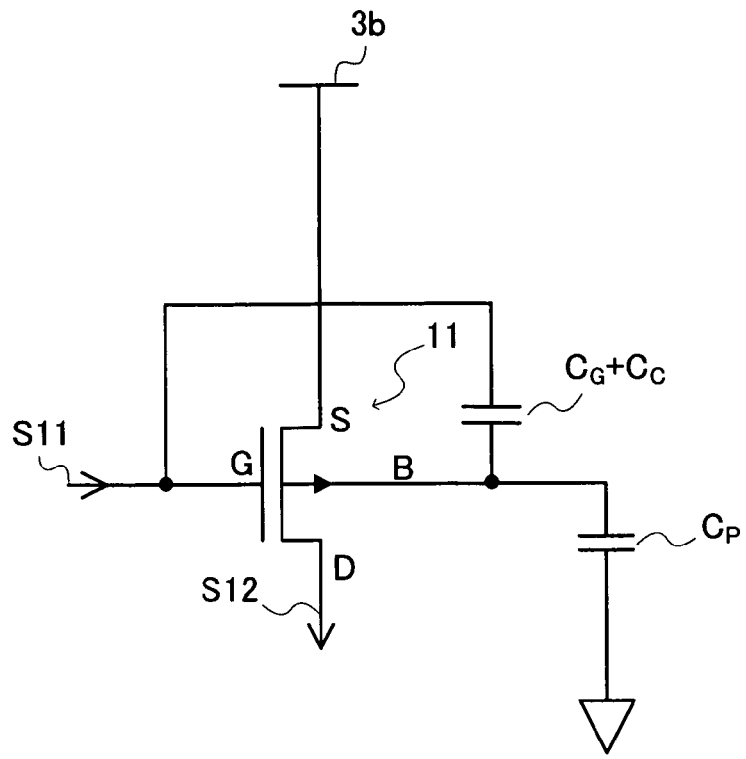
FIG. 7 is a circuit diagram showing a configuration for a PchMOS-type semiconductor apparatus of a third embodiment of the present invention.

In a third embodiment, a description is given of a PchMOS-type semiconductor apparatus. FIG. 7 is a circuit diagram showing a configuration for a PchMOS-type semiconductor apparatus of a third embodiment of the present invention. The basic circuit configuration is exactly the same other than the NchMOS-type semiconductor apparatus shown in FIG. 1 being changed to a PchMOS-type semiconductor apparatus. In the case of the PchMOS transistor 11 shown in FIG. 7, when the voltage of the gate electrode G is changed from high to low, the PchMOS transistor 11 changes from an OFF to ON state, and the substrate potential is pushed down in a negative voltage direction by coupling of a capacitor 12, so that a negative substrate potential is generated. The relational expression for the substrate potential is the same as for equation (1) of the first embodiment simply except that the polarity changes. When the voltage for the gate electrode G is changed from low to high, the PchMOS transistor 11 changes from an ON state to an OFF state, and the substrate potential is pushed up in a positive voltage direction due to bootstrap effects caused by the coupling of the capacitor 12, so that a positive substrate potential is generated. The relational expression for the substrate potential is the same as for equation (2) of the first embodiment simply except that the polarity changes. The threshold voltage of the PchMOS transistor 11 is therefore lowered (i.e. to a large negative value) and the sub-threshold leakage current between the drain electrode D and the source electrode S is reduced.

Fourth Embodiment

Figure 8:
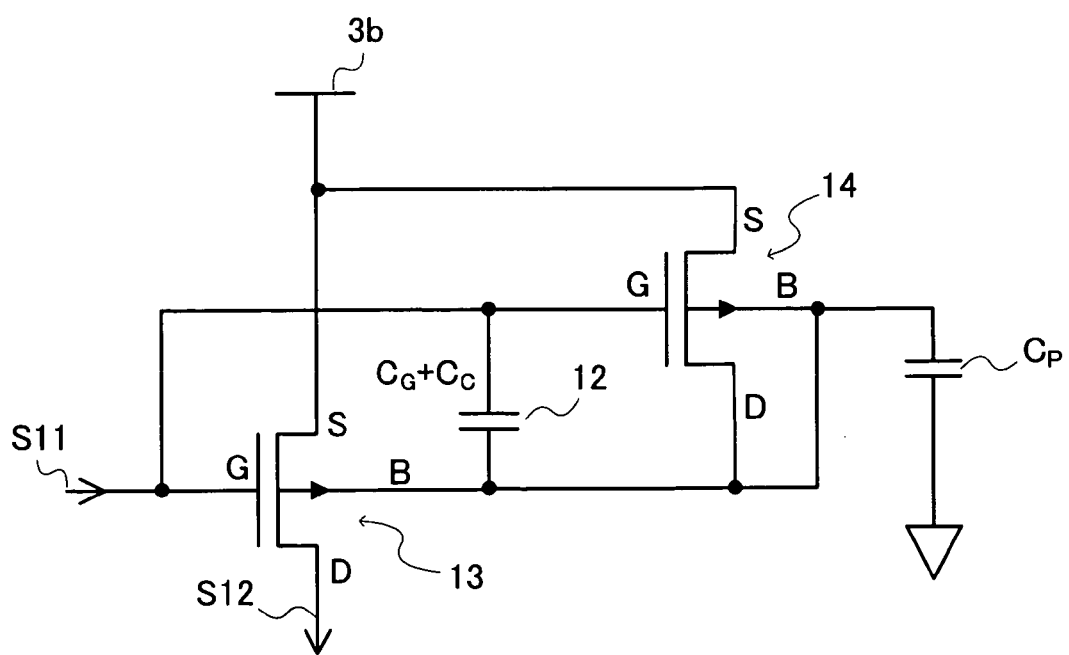
FIG. 8 is a circuit diagram showing a configuration for a PchMOS-type semiconductor apparatus of a fourth embodiment of the present invention.

In a fourth embodiment, a description is given of an example of the case of using a PchMOS-type semiconductor apparatus with respect to the second embodiment of FIG. 5 which is an NchMOS-type semiconductor apparatus. FIG. 8 is a circuit diagram showing a configuration for a PchMOS-type semiconductor apparatus of a fourth embodiment of the present invention. Other than the PchMOS-type and NchMOS-type being different, the basic circuit configuration is exactly the same, so that, when the PchMOS transistor 13 for logic circuit use is in an ON state, the silicon substrate B and a source D of the PchMOS transistor 13 for logic circuit use have the same potential, a stable substrate potential is provided. When the PchMOS transistor 13 for logic circuit use changes from an ON state to an OFF state, the substrate potential is pushed up in a positive voltage direction as far as the threshold voltage of the NchMOS transistor 10 for substrate potential control use due to capacitor coupling. It is therefore preferable to set the threshold voltage of the PchMOS transistor 13 for logic circuit use high (i.e. a positive voltage or small negative voltage), and set the threshold voltage of the PchMOS transistor 14 for substrate potential control use low (i.e. a large negative voltage).

Fifth Embodiment

Figure 9:
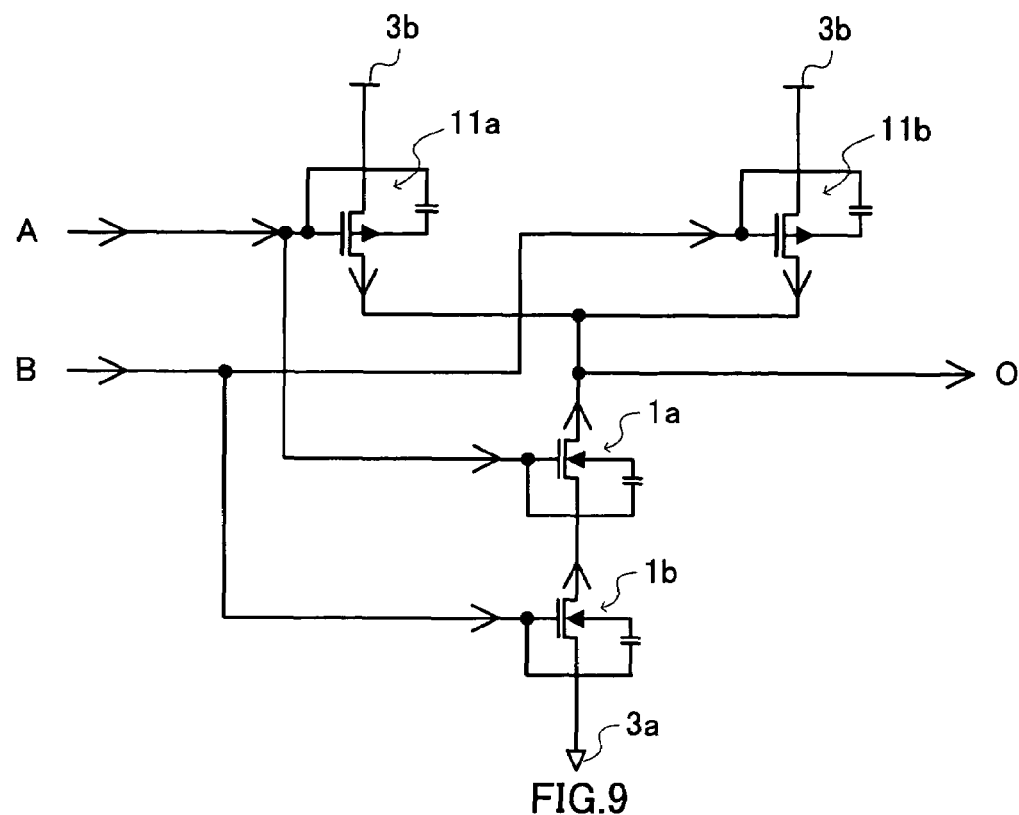
FIG. 9 is a circuit diagram showing a configuration for a semiconductor apparatus of a fifth embodiment of the present invention.

FIG. 9 is a circuit diagram showing a configuration for a semiconductor apparatus of a fifth embodiment of the present invention. Namely, the fifth embodiment shown in FIG. 9 shows an example configuration for a two-input NAND circuit made by combining two pairs of the NchMOS semiconductor apparatus of the first embodiment shown in FIG. 1 and the PchMOS semiconductor apparatus of the third embodiment shown in FIG. 7. Specifically, the semiconductor apparatus of the fifth embodiment shown in FIG. 9 is a two-input NAND circuit made by combining NchMOS transistors 1a, 1b and PchMOS transistors 11a, 11b. With this configuration, the threshold voltage changes as a result of controlling the substrate potential for each MOS transistor, enabling a logic circuit compatible with lower power consumption to be configured. It is then possible to construct other logic circuits in the same manner as the two input NAND circuit shown in FIG. 9.

Sixth Embodiment

Figure 10:
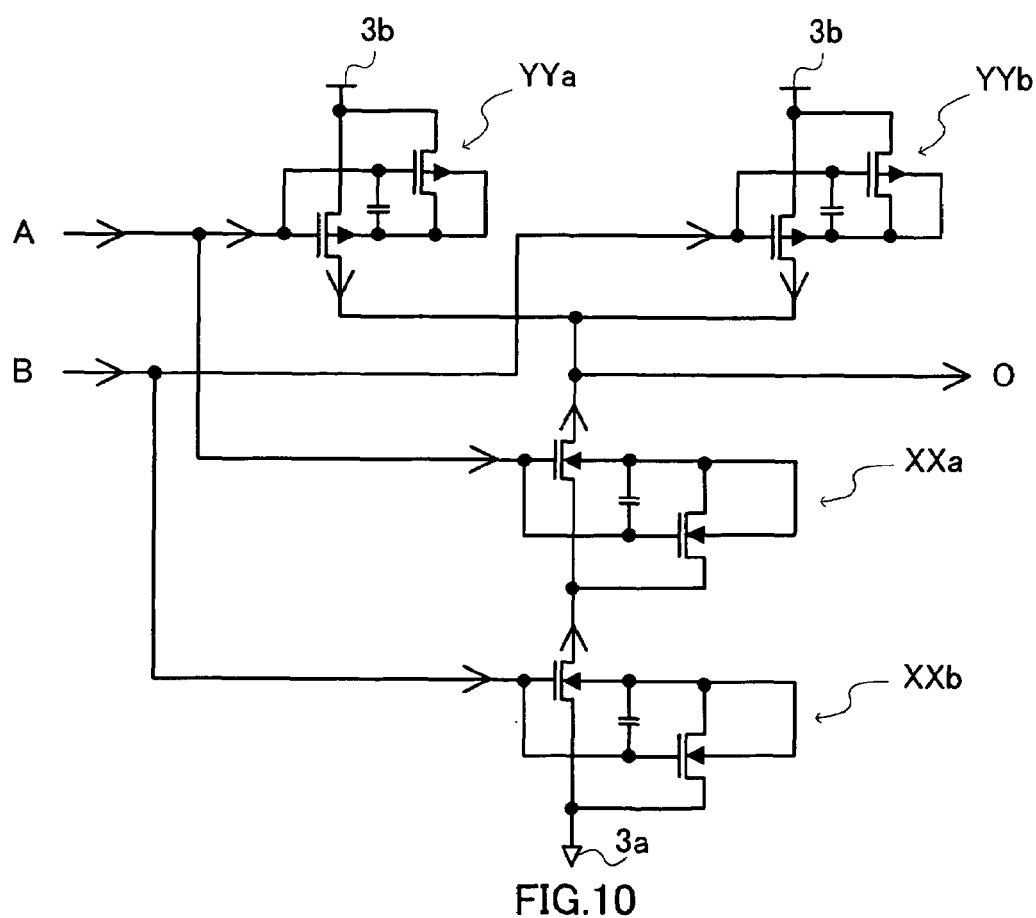
FIG. 10 is a circuit diagram showing a configuration for a sixth embodiment of the present invention.

FIG. 10 is a circuit diagram showing a configuration for a semiconductor apparatus of a sixth embodiment of the present invention. Namely, the sixth embodiment shown in FIG. 10 shows an example configuration for a two-input NAND circuit made by combining two pairs of the NchMOS semiconductor apparatus of the second embodiment shown in FIG. 5 and the PchMOS semiconductor apparatus of the fourth embodiment shown in FIG. 8. Specifically, the semiconductor apparatus of the sixth embodiment shown in FIG. 10 is a two-input NAND circuit made by combining NchMOS transistors XXa, XXb and PchMOS transistors YYa, YYb. With this configuration, the threshold voltage changes as a result of controlling the substrate potential each MOS transistor, enabling a logic circuit compatible with lower power consumption to be configured. It is then possible to configured other logic circuits in the same manner as the two-input NAND circuit shown in FIG. 12.

Seventh Embodiment

Figure 11:
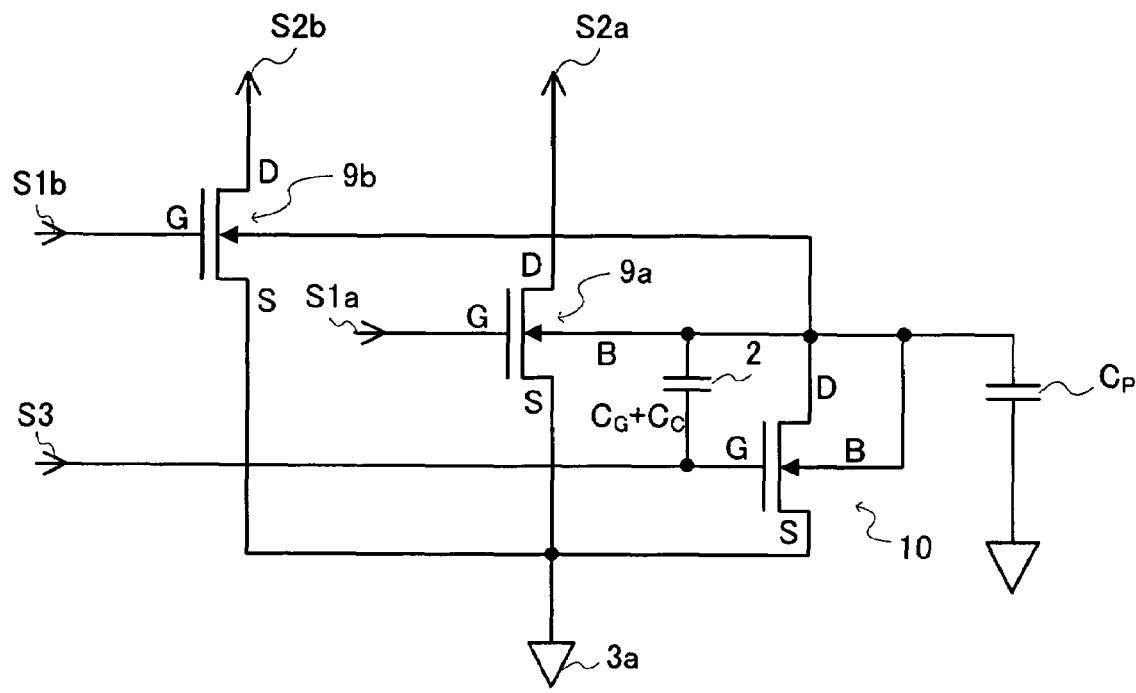
FIG. 11 is a circuit diagram showing a configuration for an NchMOS-type semiconductor apparatus of a seventh embodiment of the present invention.

FIG. 11 is a circuit diagram showing a configuration for an NchMOS-type semiconductor apparatus of an eleventh embodiment of the present invention. Namely, in FIG. 11, at the NchMOS semiconductor apparatus of the second embodiment shown in FIG. 5, the gate electrode G of an NchMOS transistor 10 for substrate potential control use and a capacitor 2 are connected to a standby control signal line S3 isolated from the gate electrode G of the NchMOS transistor 9a for logic circuit use, and, furthermore a separate NchMOS transistor 9b for logic circuit use is added. A further plurality of the NchMOS transistors 9a, 9b for logic circuit use are combined so as to configure a logic circuit.

In the case of the seventh embodiment shown in FIG. 11, substrate potential control use is carried out using the standby control signal line S3. Namely, at the time of an operating state, the standby control signal line S3 is made high, and the substrate voltage is put to the same potential as the power supply terminal 3a. Further, at the time of a standby state, the standby control signal line S3 is made low, and a negative voltage substrate bias voltage is generated at the silicon substrate B utilizing the capacitor 2. It is also preferable in this case also to set the threshold voltages of the NchMOS transistors 9a, 9b for logic circuit use low (i.e. a negative voltage or small positive voltage) and to set the threshold voltage of the NchMOS transistor 10 for substrate potential control use high (i.e. a large positive voltage).

Eighth Embodiment

Figure 12:
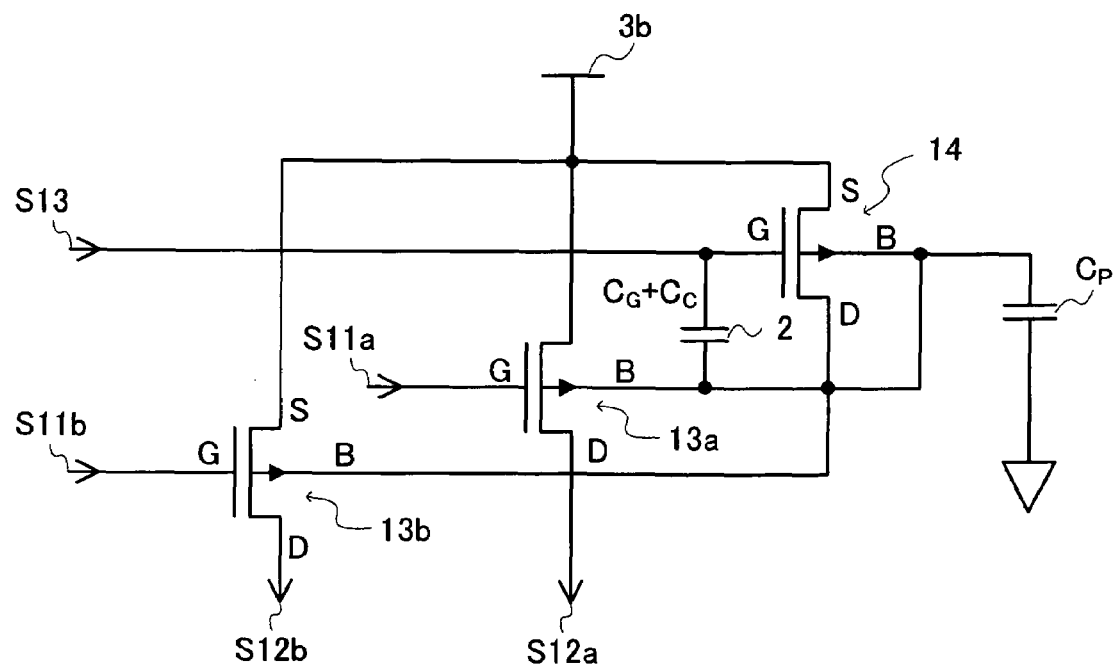
FIG. 12 is a circuit diagram showing a configuration for a PchMOS-type semiconductor apparatus of an eighth embodiment of the present invention.

FIG. 12 is a circuit diagram showing a configuration for a PchMOS-type semiconductor apparatus of an eighth embodiment of the present invention. The eighth embodiment shown in FIG. 12 is the case where a PchMOS-type semiconductor apparatus is adopted with respect to the seventh embodiment shown in FIG. 11 being an NchMOS-type semiconductor apparatus. Other than the PchMOS-type and NchMOS-type being different, the basic circuit configuration is exactly the same. Further, by combining the seventh embodiment of FIG. 11 and the eighth embodiment of FIG. 12, it is possible to generate a back-bias voltage at the silicon substrate during standby, make the threshold voltage of the NchMOS transistor for logic circuit use high (i.e. a large positive voltage), and make the threshold voltage for the PchMOS transistor for logic circuit use low (i.e. a large negative voltage), and therefore reduce power supply leakage.

According to the present invention, a substrate bias application circuit is not required, and substrate bias potential of an SOI structure is controlled in such a manner as to not become unstable when a MOS transistor is in an ON state using a straightforward method utilizing a capacitor. As a result, it is possible to simultaneously implement both high-speed operation and low power consumption at the time of standby.

Namely, it is known that, in order to make MOS transistors themselves high-speed, in addition to miniaturizing the semiconductor apparatuses and making gate lengths of MOS transistors shorter, lowering threshold voltage is extremely effective. However, typically, there is a tendency for sub-threshold leakage current that is unnecessary current flowing between a source and a drain to increase as the threshold voltage is lowered. However, the semiconductor apparatus of the present invention is configured such that isolation is provided through insulation every MOS transistor by employing an SOI structure, so that the capacitance of the silicon substrate isolated through insulation is reduced for the state of a perfectly depleted type or partially depleted type that is close to being perfectly depleted. A structure is then adopted where a signal line driving a gate of a MOS transistor and an impurity diffusion layer diffused with the same impurities as the silicon substrate are connected via a capacitor. By this means, when a MOS transistor goes on/off, the substrate bias voltage is controlled using capacitor coupling so as to make implementation of both high-speed and low power consumption of MOS transistors possible.

(1) A semiconductor apparatus of the present invention adopts a configuration where a semiconductor apparatus forming an insulating isolation region on an SOI (Silicon On Insulator) structure is composed of: a perfectly depleted or close to being perfectly depleted partially depleted-type MIS transistor formed on an electrically insulated silicon substrate surrounded by the insulating isolation region; and a capacitor formed using an insulating film, and, in this apparatus, an electrode connected to a gate electrode of the MIS transistor and an impurity diffusion layer formed within the silicon substrate and diffused with the same impurities as the silicon substrate are connected via the capacitor, and a BJT (Bipolar Junction Transistor) where a drain of the MIS transistor corresponds to a collector, the silicon substrate corresponds to a base, and a source corresponds to an emitter is formed, and when gate voltage with respect to the source is $V_{GS}$, gate capacitance of the MIS transistor is $C_G$, capacitance of the capacitor is $C_C$, parasitic capacitance is $C_P$, clamp voltage of the BJT is $V_C$, and silicon substrate potential immediately prior to gate potential changing is $V_{B(I)}$, then $V_{B(I)} + (C_G + C_C) * V_{GS}/(C_G + C_C + C_P) > V_C$.

(2) In addition to the configuration described in (1), the semiconductor apparatus of the present invention adopts a configuration where the impurity concentration of the impurity diffusion layer diffused with the same impurities as the silicon substrate is at least ten times greater than the impurity concentration of the silicon substrate.

(3) In addition to the configuration described in (1) or (2), the semiconductor apparatus of the present invention adopts a configuration where the impurity diffusion layer is arranged so as to surround the periphery of the MIS transistor.

(4) In addition to the configuration described in any one of (1) to (3), the semiconductor apparatus of the present invention adopts a configuration where the MIS transistor comprises an N-channel MIS transistor and the BJT comprises an NPN-type BJT.

(5) A semiconductor apparatus of the present invention also adopts a configuration composed of: a perfectly depleted or close to being perfectly depleted partially depleted-type N-channel MIS transistor with an insulating isolation region on an SOI structure silicon substrate, formed on an electrically insulated silicon substrate surrounded by the insulating isolation region and an N-channel MIS transistor for substrate potential control use provided between a source electrode of the N-channel MIS transistor and the silicon substrate, and, in this apparatus, a gate electrode of the N-channel MIS transistor and a gate electrode of the N-channel MIS transistor for substrate potential control use are connected, and silicon substrate potential becomes the same as the source potential when the N-channel MIS transistor goes on.

(6) In addition to the configuration described in (5), the semiconductor apparatus of the present invention adopts a configuration further having a capacitor formed using an insulating film formed on the silicon substrate, and, in this apparatus, an electrode connected to a gate electrode of the N-channel MIS transistor and an impurity diffusion layer formed within the silicon substrate and diffused with the same impurities as the silicon substrate are connected via the capacitor.

(7) In addition to the configuration described in (5) or (6), the semiconductor apparatus of the present invention adopts a configuration where, when the N-channel MIS transistor is an N-channel MIS transistor for logic circuit use, threshold voltage for the N-channel MIS transistor for substrate potential control use is set higher than a threshold voltage for the N-channel MIS transistor for logic circuit use.

(8) In addition to the configuration described in any one of (1) to (3), the semiconductor apparatus of the present invention adopts a configuration where the MIS transistor is a P-channel MIS transistor and the BJT is a PNP-type BJT.

(9) A semiconductor apparatus of the present invention also adopts a configuration where a semiconductor apparatus forming an insulating isolation region on a silicon substrate of an SOI structure has: a perfectly depleted or close to being perfectly depleted partially depleted-type P-channel MIS transistor with an insulating isolation region on an SOI structure silicon substrate, formed on an electrically insulated silicon substrate surrounded by the insulating isolation region; and a P-channel MIS transistor for substrate potential control use is added between a source electrode of the P-channel MIS transistor and the silicon substrate, and, in this apparatus, a gate electrode of the P-channel MIS transistor and a gate electrode of the P-channel MIS transistor for substrate potential control use are connected, and silicon substrate potential becomes the same as the source potential when the P-channel MIS transistor goes on.

(10) In addition to the configuration described in (9), the semiconductor apparatus of the present invention adopts a configuration where a semiconductor apparatus has a capacitor formed using an insulating film formed on the silicon substrate, and, in this apparatus, an electrode connected to a gate electrode of the P-channel MIS transistor and an impurity diffusion layer formed within the silicon substrate and diffused with the same impurities as the silicon substrate are connected via the capacitor.

(11) In addition to the configuration described in (9) or (10), the semiconductor apparatus of the present invention adopts a configuration where threshold voltage of the P-channel MIS transistor for substrate potential control use is set lower than threshold voltage for the P-channel MIS transistor for logic circuit use in the case that the P-channel MIS transistor is taken to be a P-channel MIS transistor for logic circuit use.

(12) In addition to the configuration described in any of (1) to (4), (6) to (8), (10) or (11), the semiconductor apparatus of the present invention adopts a configuration where the capacitor is configured using an oxidation film formed between the impurity diffusion layer and the electrode.

(13) In addition to the configuration described in any of (1) to (4), (6) to (8), (10) or (11), the semiconductor apparatus of the present invention adopts a configuration where the capacitor is configured from a capacitance between metal within a trench formed within the insulating isolation region and the silicon substrate and/or the impurity diffusion layer.

(14) In addition to the configuration described in any of (1) to (4), (6) to (8), (10) or (11), the semiconductor apparatus of the present invention adopts a configuration where the capacitor is composed of a first capacitor configured using an oxidation film formed between the impurity diffusion layer and the electrode, and a second capacitor configured using a capacitance between metal within a trench formed within the insulating isolation region and the silicon substrate and/or the impurity diffusion layer.

(15) A semiconductor apparatus of the present invention forming an insulating isolation region on an SOI structure silicon substrate is composed of: one or a plurality of perfectly depleted or close to being perfectly depleted partially depleted-type N-channel MIS transistors formed on an electrically insulated silicon substrate surrounded by the insulating isolation region; and a capacitor formed using an insulating film, and, in this apparatus, and an N-channel MIS transistor for substrate potential control use, and, in this apparatus, the N-channel MIS transistor for substrate potential control use is connected between source electrodes of the one or a plurality of N-channel MIS transistors and the silicon substrate, an electrode connected to a gate electrode of the N-channel MIS transistor for substrate potential control use and an impurity diffusion layer formed within the silicon substrate and diffused with the same impurities as the silicon substrate are connected via the capacitor, and the capacitor and the gate electrode of the N-channel MIS transistor for reference potential control use are isolated from the one or plurality of N-channel MIS transistor gate electrodes.

(16) A semiconductor apparatus of the present invention forming an insulating isolation region on an SOI structure silicon substrate is composed: of one or a plurality of perfectly depleted or close to being perfectly depleted partially depleted-type P-channel MIS transistors formed on an electrically insulated silicon substrate surrounded by the insulating isolation region; and a capacitor formed using an insulating film, and, in this apparatus, a P-channel MIS transistor for substrate potential control use, the P-channel MIS transistor for substrate potential control use is connected between a source electrode of the one or a plurality of P-channel MIS transistors and the silicon substrate, an electrode connected to a gate electrode of the P-channel MIS transistor for substrate potential control use and an impurity diffusion layer formed within the silicon substrate and diffused with the same impurities as the silicon substrate are connected via the capacitor, and the capacitor and the gate electrode of the P-channel MIS transistor for reference potential control use are isolated from the one or plurality of P-channel MIS transistor gate electrodes.

(17) A complimentary MIS logic circuit of the present invention may adopt the configuration of being configured from the semiconductor apparatus described in (4) and any of the semiconductor apparatuses described in (8) to (11).

(18) A complimentary MIS logic circuit of the present invention may adopt the configuration of being configured from the semiconductor apparatus described in (5) and any of the semiconductor apparatuses described in (8) to (11).

(19) A complimentary MIS logic circuit of the present invention may adopt the configuration of being configured from the semiconductor apparatus described in (6) and any of the semiconductor apparatuses described in (8) to (11).

(20) A complimentary MIS logic circuit of the present invention may adopt the configuration of being configured from the semiconductor apparatus described in (7) and any of the semiconductor apparatuses described in (8) to (11).

Namely, the semiconductor apparatus of the present invention is configured such that isolation is provided through insulation every MOS transistor by employing an SOI structure silicon substrate, and the capacitance of the silicon substrate isolated through insulation is reduced for the state of a perfectly depleted type or partially depleted type that is close to this. In addition to the MOS transistor, a capacitor is added between a signal line driving the gate of the MOS transistor and an impurity diffusion layer (hereafter simply referred to as "diffusion layer of the same impurities as the silicon substrate") as the silicon substrate. By this means, it is possible to increase capacitance between the gate electrode and the silicon substrate and it is possible to broaden substrate potential control use over the whole of the silicon substrate by using an impurity diffusion layer. When a gate voltage is then applied so that the MOS transistor goes on, it is easy for the substrate to fluctuate to a voltage greater than the clamp voltage of a diode constituted by the base and emitter of the BJT as a result of increased capacitance between the gate electrode and the silicon substrate, substrate potential is stabilized as a result, and the threshold voltage becomes small. When the MOS transistor goes off, it is possible for a back bias voltage to be generated at the substrate so that the threshold voltage becomes large.

In addition to the above configuration, it is also possible to add a MOS transistor for substrate potential control use having a gate connected to the gate electrode of the MOS transistor between the source electrically connected to the impurity diffusion layer and the same impurity diffusion layer. By this means, when the MOS transistor is on, it is possible to make the substrate potential the same as the source potential of the MOS transistor and to make the substrate potential a stable substrate potential. Similarly, when the MOS transistor is off, a back-bias voltage is generated, and it is possible to make the threshold voltage large.

Further, it is also possible to connect the gate of the MOS transistor for substrate potential control use and a capacitor terminal on the opposite side to a terminal connected to the impurity diffusion layer that is the same as the silicon substrate, to a standby control signal. As a result, it is possible to make the substrate potential at the time of circuit operation the same as the source potential using the standby control signal and to generate a back-bias at the silicon substrate during standby.

The above structure can be applied to NchMOS transistors and P channel (hereinafter described as "Pch") MOS transistors. Further, a structure is adopted where the capacitor is formed of an oxidation film using the same method as for a normal gate on the same impurity diffusion layer as for the silicon substrate, with polysilicon formed on top. Moreover, it is possible to form a capacitor between metal in the insulating isolation region and the silicon substrate and/or impurities diffusion region that is the same as the silicon substrate by cutting a trench in the insulating isolation region and depositing metal.

The semiconductor apparatus of the present invention is capable of controlling substrate bias voltage without requiring a circuit for applying a substrate bias voltage by insulating and isolating each MOS transistor using an SOI structure, reducing substrate capacitance in a perfectly depleted state or a partially depleted state close to a perfectly depleted state, and connecting a signal line driving a gate of the MOS transistor and an impurity diffusion layer the same as the substrate via a capacitor. It is therefore possible to manufacture a semiconductor integrated circuit capable of simultaneously implementing both high-speed operation and low power consumption during standby in a straightforward manner.

The present invention is not limited to the above described embodiments, and various variations and modifications may be possible without departing from the scope of the present invention.

This application is based on Japanese Patent Application No.2005-48877, filed on Feb. 24, 2005, Japanese Patent Application No.2005-243310, filed on Aug. 24, 2005, the entire content of which is expressly incorporated by reference herein.

What is claimed is:

1. A semiconductor apparatus forming an insulating isolation region on a silicon substrate of an SOI (Silicon On Insulator) structure, wherein:
   the semiconductor apparatus comprises:
   a perfectly depleted or close to being perfectly depleted partially depleted-type MIS transistor formed on an electrically insulated silicon substrate surrounded by the insulating isolation region; and
   a capacitor formed using an insulating film, wherein the capacitor is configured from a capacitance between metal within a trench formed within the insulating isolation region and the silicon substrate and/or an impurity diffusion layer;
   an electrode connected to a gate electrode of the MIS transistor and an impurity diffusion layer formed within the silicon substrate and diffused with the same impurities as the silicon substrate are connected via the capacitor; and
   a BJT (Bipolar Junction Transistor) where a drain of the MIS transistor corresponds to a collector, the silicon substrate corresponds to a base, and a source corresponds to an emitter is formed, and where, when gate voltage with respect to the source is $V_{GS}$, gate capacitance of the MIS transistor is $C_G$, capacitance of the capacitor is $C_C$, parasitic capacitance is $C_P$, clamp voltage of the BJT is $V_C$, and silicon substrate potential immediately prior to change in gate potential is $V_{B(I)}$, then $V_{B(I)}+(C_G+C_C)*V_{GS}/(C_G+C_C+C_P)>V_C$.

2. A semiconductor apparatus forming an insulating isolation region on a silicon substrate of an SOI (Silicon On Insulator) structure, wherein:
   the semiconductor apparatus comprises:
   a perfectly depleted or close to being perfectly depleted partially depleted-type MIS transistor formed on an electrically insulated silicon substrate surrounded by the insulating isolation region; and
   a capacitor comprising:
      a first capacitor configured using an oxidation film formed between the impurity diffusion layer and the electrode; and
      a second capacitor configured using a capacitance between metal within a trench formed within the insulating isolation region and the silicon substrate and/or the impurity diffusion layer;
   an electrode connected to a gate electrode of the MIS transistor and an impurity diffusion layer formed within the silicon substrate and diffused with the same impurities as the silicon substrate are connected via the capacitor; and
   a BJT (Bipolar Junction Transistor) where a drain of the MIS transistor corresponds to a collector, the silicon substrate corresponds to a base, and a source corresponds to an emitter is formed, and where, when gate voltage with respect to the source is $V_{GS}$, gate capacitance of the MIS transistor is $C_G$, capacitance of the capacitor is $C_C$, parasitic capacitance is $C_P$, clamp voltage of the BJT is $V_C$, and silicon substrate potential immediately prior to change in gate potential is $V_{B(I)}$, then $V_{B(I)}+(C_G+C_C)*V_{GS}/(C_G+C_C+C_P)>V_C$.

* * * * *